(12) United States Patent
Morthier et al.

(10) Patent No.: US 6,366,382 B1
(45) Date of Patent: Apr. 2, 2002

(54) OPTICAL DECISION CIRCUIT AND USE THEREOF

(75) Inventors: Geert Morthier, Ghent; Roel Baets, Deinze, both of (BE)

(73) Assignees: IMEC; University of Gent, both of Leuven (BE)

(*) Notice: Subject to any disclaimer, the term of this patent is extended or adjusted under 35 U.S.C. 154(b) by 0 days.

(21) Appl. No.: 09/141,458

(22) Filed: Aug. 27, 1998

Related U.S. Application Data
(60) Provisional application No. 60/057,224, filed on Aug. 27, 1997.

(30) Foreign Application Priority Data

Feb. 10, 1998 (EP) .............................................. 98870027

(51) Int. Cl.⁷ .............................................. H04B 10/17
(52) U.S. Cl. ........................ 359/179; 359/158; 359/349
(58) Field of Search ................................ 359/174, 176, 359/158, 333, 349, 179

(56) References Cited

U.S. PATENT DOCUMENTS

| | | | | | |
|---|---|---|---|---|---|
| 5,611,005 A | * | 3/1997 | Heismann et al. | ............. | 385/11 |
| 5,673,140 A | * | 9/1997 | Fisher | ......................... | 359/332 |
| 5,673,141 A | * | 9/1997 | Gambini | ..................... | 359/341 |
| 5,870,512 A | * | 2/1999 | Koch et al. | .................... | 385/14 |
| 5,933,554 A | * | 8/1999 | Leuthold et al. | .............. | 385/28 |
| 5,999,283 A | * | 12/1999 | Roberts et al. | ............. | 359/108 |
| 5,999,284 A | * | 12/1999 | Roberts | ....................... | 359/108 |
| 6,118,117 A | * | 9/2000 | Ducellier et al. | ........... | 350/214 |

FOREIGN PATENT DOCUMENTS

| | | |
|---|---|---|
| WO | WO 96 22562 | 7/1996 |
| WO | WO-96/24080 | * 8/1996 |

OTHER PUBLICATIONS

Ratovelomanan, F., et al: "An All–Optical Wavelength–Converter with Semiconductor Optical Amplifiers Monolithically Integrated in an Asymmetric Passive Mach–Zehnder Interferometer" IEEE Photonics Technology Letters, vol. 7, No. 9, Sep. 1, 1995, pp. 992–994, XP000527498.

Dobbelaere, G., et al: "Analysis of Biasing Modes of Asymmetric Mach–Zehnder Semiconductor Optical Amplifier Based All–Optical Wavelength Convertors" Electronics Letters, vol. 30, No. 22, Oct. 27, 1994, pp. 1856–1858, XP000479765.

* cited by examiner

Primary Examiner—Leslie Pascal
(74) Attorney, Agent, or Firm—Knobbe, Martens, Olson & Bear, LLP (57) ABSTRACT

An optical decision circuit, based on gain clamped semiconductor optical amplifiers, is disclosed. This optical decision circuit can be used for 2R signal regeneration in optical communication systems. By adding a clock signal to the input of said optical decision circuit, said circuit is also suited for 3R regeneration. Such a circuit can easily be implemented as an integrated circuit or an OEIC.

13 Claims, 6 Drawing Sheets

FIG. 1A — generated signal

FIG. 1B — input signal

FIG. 1C — output signal

OPTICAL DECISION CIRCUIT AND USE THEREOF

This application claims benefit of provisional application No. 60/057,224, filed Aug. 27, 1997.

FIELD OF THE INVENTION

The present invention is related to an optical decision circuit, based on semiconductor optical amplifiers, which can be used for signal regeneration in optical communication systems. Such a circuit can easily be implemented as an integrated circuit or an OEIC.

BACKGROUND OF THE INVENTION

In optical long-haul communication systems, signal regeneration at regular distances is a prerequisite because several mechanisms deteriorate the optical signals. Examples of such mechanisms are pure transmission losses and different noise and signal distortion sources in communication components. Therefore there is a common interest in simple high quality optical regeneration circuits which can easily be integrated.

Several signal regeneration mechanisms are known, as illustrated in FIG. 1, to improve the signals at regular distances or times. A generated signal, like e.g. a periodic Return to Zero pulse signal (FIG. 1, $a$) or any other signal comprising a number of pulses which are at regularly spaced points in time (e.g. :$t_0$, $t_1$, $t_2$), enters an optical fiber. After a certain distance, the signal is deteriorated as illustrated e.g. in FIG. 1, $b$ and needs to be regenerated. The simplest regeneration system is the so-called 1R regeneration (FIG. 1, $c$), which is in fact an amplification system. The input signal (FIG. 1, $b$) is amplified in order to bring the signal power level sufficiently above the noise level as illustrated in FIG. 1, $c$.

A more advanced system is the so-called 2R regeneration (FIG. 1, $d$). An optical input signal (FIG. 1, $b$) which is presented to a 2R regeneration system is set to a fixed high output signal level if the power of the input signal is above a certain threshold level and is set to a fixed low output level if otherwise. This regeneration allows to choose a more optimum decision threshold, i.e. a certain optical power level, at the receivers but in many cases this is still not satisfying.

An even more advanced system is the so-called 3R regeneration (FIG. 1, $e$). An optical input signal (FIG. 1, $b$) which is presented to a 3R regeneration system is set to a fixed high output signal level if the power of the input signal is above a certain threshold level and is set to a fixed low output level if otherwise. Furthermore a clock signal (FIG. 1, $e$), having the same period as the generated signal (FIG. 1, $a$), is used to retime the input signal pulses in order to coincide exactly with the clock pulses. The retiming allows to remove the signal jitter, i.e. fluctuations in the start instant of the pulses. Since the sampling at the receiver side occurs at instants defined by a periodic clock signal, this time jitter can cause additional detection errors, especially for very high bit rates.

So far, regeneration in optical communication has mainly been 1R regeneration using Erbium-doped fibre amplifiers. 3R regeneration has however been under investigation for several years and has been reported in the literature, e.g. in J. K. Lucek, K. Smith, 'All-optical signal regenerator', Optics Letters, Vol. 18, pp. 1226–1228, 1993. The clock signal is typically extracted from the signal using a mode locked laser as e.g. in P. B. Hansen et al., 'All-optical clock recovery using a mode-locked laser', El. Lett., Vol. 29, pp. 739–741, 1993, and regeneration is based on a non-linear fibre loop mirror, in which the clock signal is modulated by the signal. This technique however involves a complicated combination of fibre based components, making the regeneration circuit spacious and unsuitable for integration. Besides, it only works for certain modulation formats.

SUMMARY OF THE INVENTION

An important part of an optical regeneration system can be a so-called optical decision circuit. An optical decision circuit can be used both for 2R and 3R regeneration. Consequently, for 2R regeneration an optical decision circuit should give a low output power level, i.e. ideally this low level is a zero output power level, if the input power is below a certain threshold value and should give a high output power level, i.e. ideally this high level is a constant predetermined high output power level, if the input power is above the threshold value and there should be a steep transition between the low level and the high level. In a practical implementation, the low level may be small, but different from zero, the high level may slightly vary with input power and the transition between low and high level may be more gradual.

According to the present invention a device with an optical signal at its input and an optical signal at its output for optical signal regeneration is disclosed, where said optical output signal has a predetermined output power level, said device comprising:

a beam splitter for splitting said optical input signal in at least a first and a second signal;

at least a first and a second gain clamped optical amplifier, said first amplifier amplifying said first signal, said second amplifier amplifying said second signal, said first and said second amplifier having a different saturation input power level;

a phase shifting element for shifting the phase of either one of said first signal or said second signal;

a combiner for combining said first and said second signal. Preferably said phase is shifted such that the phase difference between said first signal and said second signal is essentially 180 degrees.

In an embodiment of the invention an optical decision circuit is disclosed, comprising a Mach-Zehnder interferometer (MZI) and two gain clamped semiconductor optical amplifiers (GCSOA's) and where said interferometer further comprises a splitter, a phase shifting element and a combiner. The GCSOA's are located in the branches of the interferometer.

In an embodiment of the invention an optical decision circuit is configured such that the beamsplitter for the incident signal as well as the combiner for the output signal are substantially symmetric giving a splitting and combining ratio of 50/50. When the input power of the incident signal is below a certain threshold value the optical decision circuit should return a low output power level, i.e. ideally a zero output power level. In this configuration, the amplitude of a first signal incident on a first GCSOA and the amplitude of a second signal incident on a second GCSOA is the same due to the 50/50 splitting ratio. After amplification of these signals, at least the phase of one of the signals is shifted such that the phase difference between the first signal and the second signal is essentially 180 degrees. Consequently, thereafter combining the first and the second signal using a combiner with a combining ratio of 50/50 is in fact substracting the first and the second signal one from another.

Therefore, in order to establish a low output power level the amplification factor for input values below the threshold value should be substantially the same. To accomplish this, preferably, the optical decision circuit should further comprise two essentially identical GCSOA's, i.e. two GCSOA's having essentially the same structure, essentially the same dimensions and being composed of essentially the same materials.

In an embodiment of the invention an optical decision circuit is configured such that either the beamsplitter for the incident signal or the combiner for the output signal or the beamsplitter and the combiner are asymmetric giving a splitting ratio of $\alpha/(100-\alpha)$, $\alpha$ being different from 50 and $0<\alpha<100$, and/or a combining ratio of $\beta/(100-\beta)$, $\beta$ being different from 50 and $0<\beta<100$. When the input power of the incident signal is below a certain threshold value the optical decision circuit should return a low output power level, i.e. ideally a zero output power level. In this configuration, the amplitude of a first signal incident on a first GCSOA and the amplitude of a second signal incident on a second GCSOA can be substantially different due to the asymmetric splitting ratio. After amplification of these signals, at least the phase of one of the signals is shifted such that the phase difference between the first signal and the second signal is essentially 180 degrees. Consequently, thereafter combining the first and the second signal using a combiner with a combining ratio which can be asymmetric is in fact substracting the first and the second signal one from another. Therefore, this optical decision circuit should comprise two different GCSOA's, said GCSOA's should be chosen dependent on the value of the splitting ratio and the value of the combining ratio in order to establish a low output power level of the optical decision circuit for input powers below the threshold value.

In an embodiment of the invention as an alternative an optical decision circuit is disclosed comprising a Michelson interferometer and two essentially identical reflecting GCSOA's. The interferometer further comprises a 3 dB coupler, being used both as a beam splitter for the incident signal and as a combiner for the output signals of the reflecting GCSOA's, and a phase shifting element.

In an aspect of the invention an optical decision circuit is disclosed for 3R regeneration, i.e. including retiming. Like for 2R regeneration this optical decision circuit should give a low output power level, i.e. ideally this low level is a zero output power level, if the input power is below a certain threshold value and should give a high output power level, i.e. ideally this high level is a constant predetermined high output power level, if the input power is above the threshold value and there should be a steep transition between the low level and the high level. However by adding a clock signal to the input signal incident on the optical decision circuit, said clock signal having the same period as said input signal, at predetermined times the amplitude of the total signal incident on the optical decision circuit is enhanced resulting in a shift of said transition between said low output power level and said high output power level to thereby establish a regeneration and a retiming of said input signal.

According to the present invention a device with an optical signal at its input and an optical signal at its output for optical signal regeneration is disclosed, where said optical output signal has a predetermined output power level, said device comprising:

a beam splitter for splitting said optical input signal, said optical input signal being a combination of an optical signal incident on said device and a clock signal having the same period as said incident optical signal, in at least a first and a second signal;

at least a first and a second gain clamped optical amplifier, said first amplifier amplifying said first signal, said second amplifier amplifying said second signal, said first and said second amplifier having a different saturation input power level;

a phase shifting element for shifting the phase of either one of said first signal or said second signal;

a combiner for combining said first and said second signal. Preferably said phase is shifted such that the phase difference between said first signal and said second signal is essentially 180 degrees.

In an aspect of the invention a method to achieve regeneration of an optical input signal is disclosed comprising the steps of:

splitting said input signal in at least a first signal and a second signal;

amplifying said first signal by means of a first gain clamped optical amplifier and amplifying said second signal by means of a second gain clamped optical amplifier, said first and said second amplifier having a different saturation input power level;

shifting the phase of either one of said first signal or said second signal;

combining said first and said second signal thereby forming an optical output signal; and wherein said optical output signal has a predetermined output power level. Particularly said optical output signal has a predetermined high output power level or a low output power level, said low level being substantially below said predetermined high output power level, or an output power level inbetween said high output power level and said low output power level In another aspect of the invention a method to achieve regeneration of an optical input signal is disclosed comprising the steps of:

combining a clock signal, having the same period as said optical signal, with said optical signal thereby forming an optical signal incident on an optical decision circuit;

splitting said incident signal in at least a first signal and a second signal;

amplifying said first signal by means of a first gain clamped optical amplifier and amplifying said second signal by means of a second gain clamped optical amplifier, said first and said second amplifier having a different saturation input power level;

shifting the phase of either one of said first signal or said second signal;

combining said first and said second signal thereby forming an optical output signal; and wherein said optical output signal has a predetermined output power level.

DETAILED DESCRIPTION OF THE INVENTION

In an aspect of the invention a device with an optical signal at its input and an optical signal at its output for optical signal regeneration is disclosed, where said optical output signal has a predetermined output power level, said device comprising:

a beam splitter for splitting said optical input signal in at least a first and a second signal;

at least a first and a second gain clamped optical amplifier, said first amplifier amplifying said first signal, said second amplifier amplifying said second signal, said first and said second amplifier having a different saturation input power level;

a phase shifting element for shifting the phase of either one of said first signal or said second signal;

a combiner for combining said first and said second signal. Preferably said phase is shifted such that the phase difference between said first signal and said second signal is essentially 180 degrees.

Figure 1A:
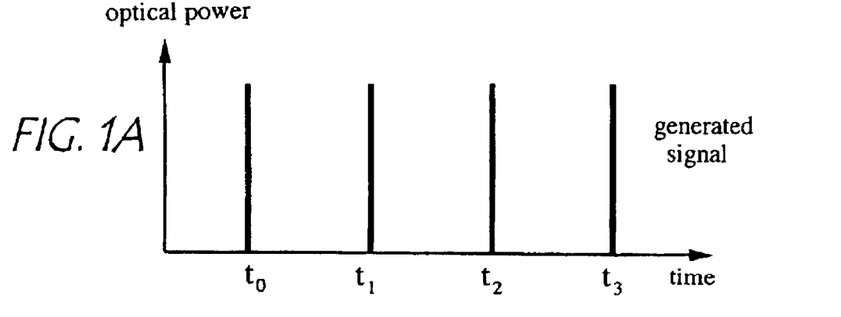
FIG. 1 represents several state-of-the-art regeneration principles for optical signals, i.e. RZ pulses.
Figure 1B:
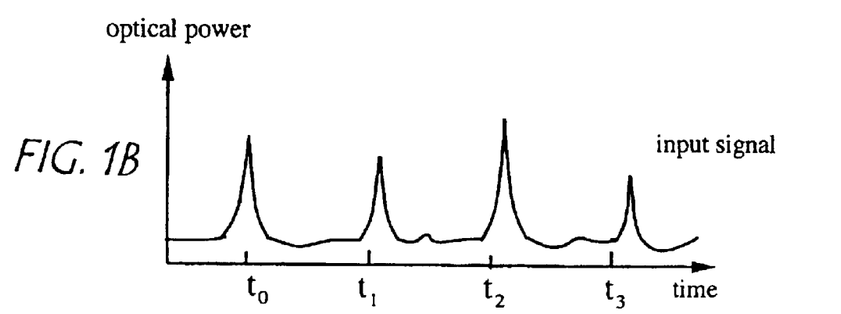
Figure 1C:
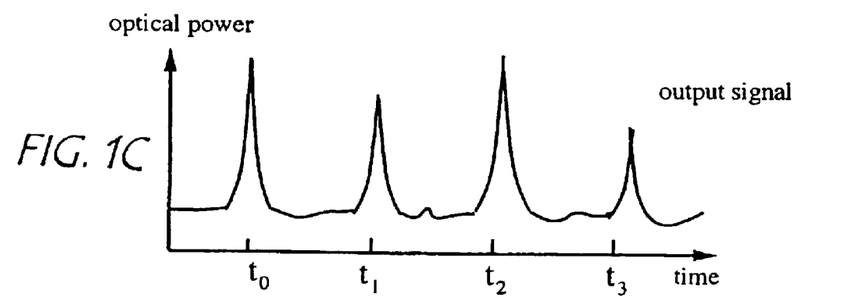
Figure 1D:
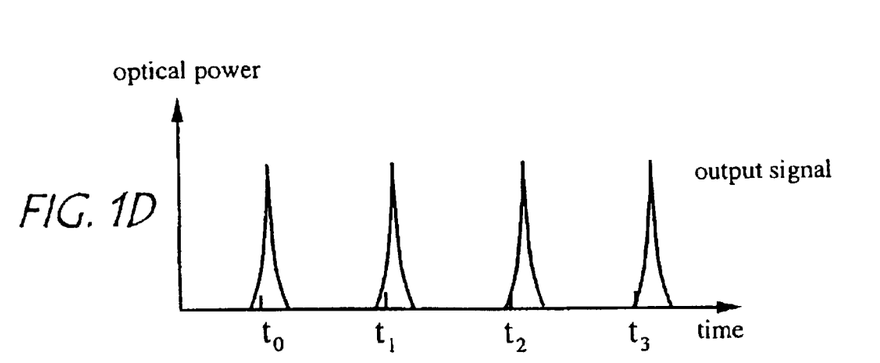
Figure 1E:
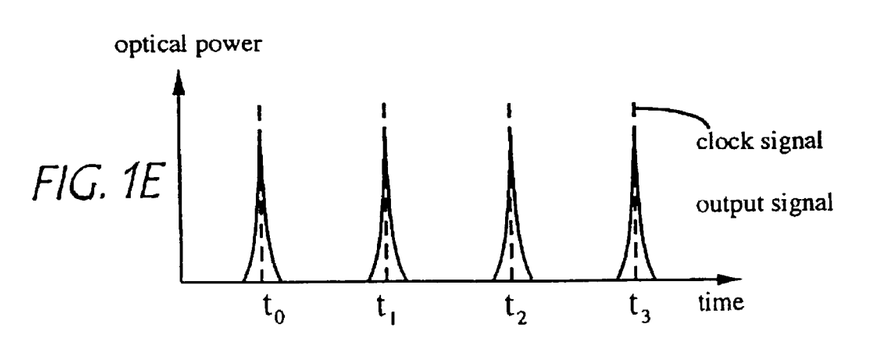
Figure 2:
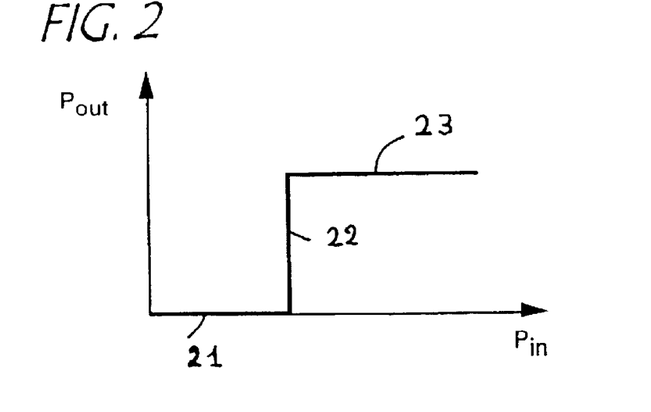
FIG. 2 represents the output characteristic, i.e. the optical output power versus the input power, of an ideal optical decision circuit according to an embodiment of the invention.
Figure 3:
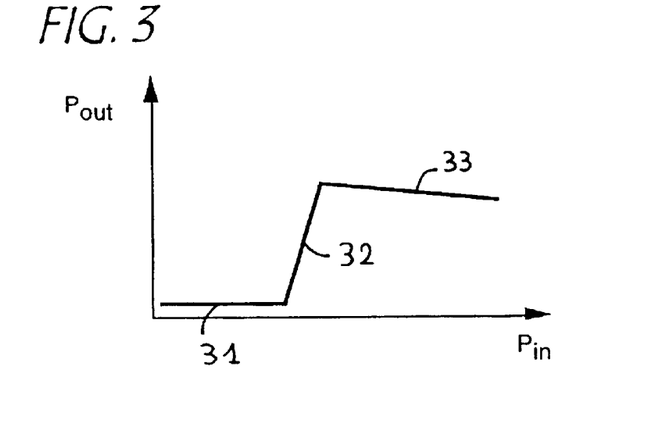
FIG. 3 represents the output characteristic, i.e. the optical output power versus the input power, of an optical decision circuit according to an embodiment of the invention.

According to the invention an optical decision circuit should give (see FIG. 2) a low output power level, i.e. ideally this low level is a zero output power level (21), if the input power is below a certain threshold value. This optical decision circuit should give a predetermined high output power level, i.e. ideally this predetermined high level is a constant level (23), if the input power is above the threshold value and their should be a steep transition (22) between the low level and the high level. In a practical implementation (see FIG. 3), the low level (31) instead of being zero may be an output power level which is substantially below the predetermined high output power level, the high level (33) may slightly vary with input power and the transition between low and high level may be more gradual (32). Particularly, without limiting the scope of the invention, said predetermined high output power level can be chosen in accordance with the amplitude of the originally generated signal, i.e. before it is deteriorated and needs to be regenerated, but there are many other ways to predetermine a value for high output power level. For example, when said predetermined high output power level is chosen in accordance with the amplitude of the originally generated signal, then said high output power level can have about the same value as the amplitude of the originally generated signal. Said low output power level can typically have a value which is at least 5 dB below or preferably at least 10 dB below the predetermined high output power level.

Figure 5:
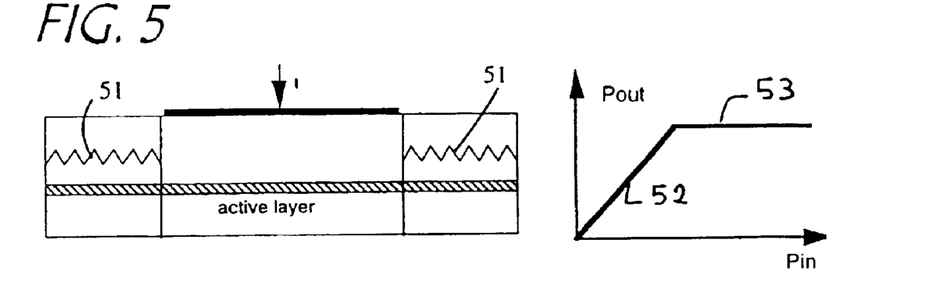
FIG. 5 represents a schematic example of a state-of-the-art device structure of a GCSOA and a simplified typical output characteristic of such a GCSOA.
Figure 6:
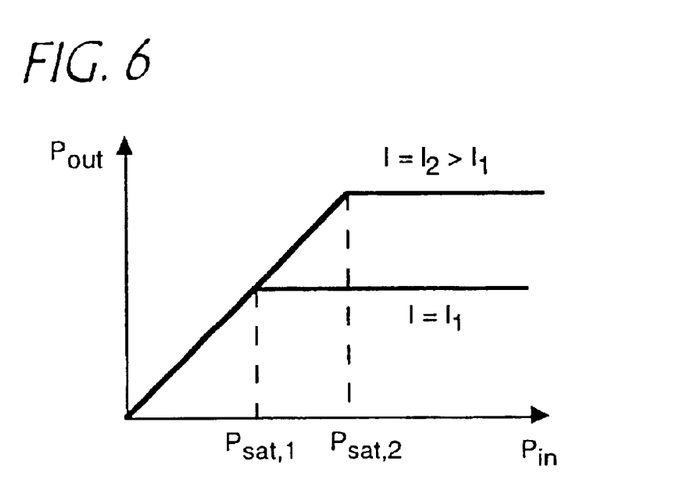
FIG. 6 represents the simplified output characteristics, i.e. output power versus input power, of a state-of-the-art GCSOA at two different bias currents.

The GCSOA's (as in J. C. Simon et al., 'Travelling wave semiconductor optical amplifier with reduced non-linear distortions', El. Lett., Vol. 30, pp. 49–50, 1994) in this optical circuit are amplifiers in which lasing occurs usually at a wavelength sufficiently far apart from the signal wavelength. The lasing operation causes the carrier density and thus the signal gain to be clamped (i.e. to be independent from the input signal power level) at the lasing wavelength. Consequently, each laser with a strong feedback in a narrow spectral region only and which operates above his oscillation threshold can be applied because its gain is clamped. By adequately choosing the Bragg gratings (51) (see FIG. 5) of the active structure, the signal gain is also clamped at wavelengths different from the lasing wavelength. Said Bragg gratings are chosen to provide high reflection at the lasing wavelength and little or no reflection at the signal wavelength. There are several equivalent implementations, known to a person skilled in the art, to achieve this effect. An example of such an equivalent implementation can be by using external reflectors in stead of Bragg gratings. The signal gain of a GCSOA remains constant with increasing input power because variations in input signal power are balanced by opposite variations in lasing power such that the total stimulated emission rate remains constant. However, this mechanism only works up to a certain input power level, above which the lasing power is zero and above which an increase of the input power causes a decrease of the carrier density and hence of the signal gain. The resulting relation between the input and the output power therefore is depicted in FIG. 5, i.e. linear (52) up to a certain input power level, hereafter designated as the saturation input power, and with constant output power (53) above that limit. The saturation input power itself increases linearly with the current injected into the GCSOA, as shown in FIG. 6. The signal gain in the linear regime is totally determined by structure and material parameters such as the Bragg gratings, the length and the internal loss of the active structure, but is independent of the current.

In an embodiment of the invention an optical decision circuit is configured such that the beamsplitter for the incident signal as well as the combiner for the output signal are substantially symmetric giving a splitting and combining ratio of 50/50. When the input power of the incident signal is below a certain threshold value the optical decision circuit should return a low output power level, i.e. ideally a zero output power level or substantially below the predetermined high output power level. In this configuration, the amplitude of a first signal incident on a first GCSOA and the amplitude of a second signal incident on a second GCSOA is the same due to the 50/50 splitting ratio. After amplification of these signals, at least the phase of one of the signals is shifted such that the phase difference between the first signal and the second signal is essentially 180 degrees. Consequently, thereafter combining the first and the second signal using a combiner with a combining ratio of 50/50 is in fact substracting the first and the second signal one from another. Therefore, in order to establish a low output power level the amplification factor for input values below the threshold value should be substantially the same. To accomplish this, preferably, the optical decision circuit should further comprise two essentially identical GCSOA's, i.e. two GCSOA's having essentially the same structure, essentially the same dimensions and being composed of essentially the same materials.

Figure 4:
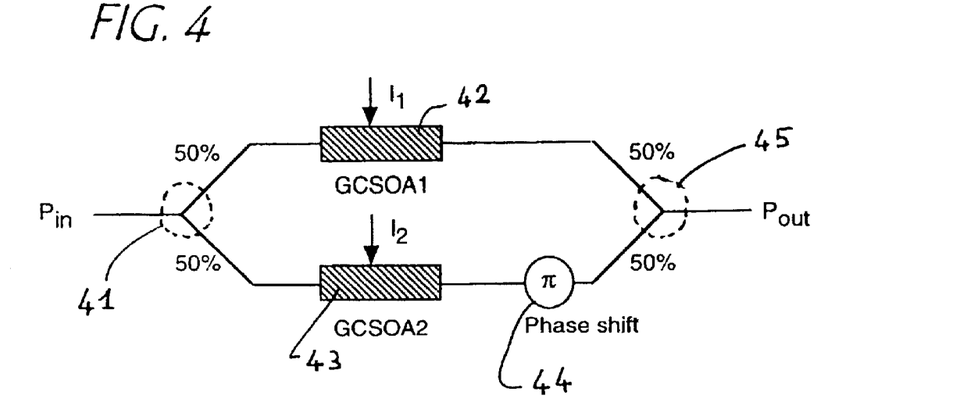
FIG. 4 represents a schematic example of an implementation of an optical decision circuit according to an embodiment of the invention.
Figure 7:
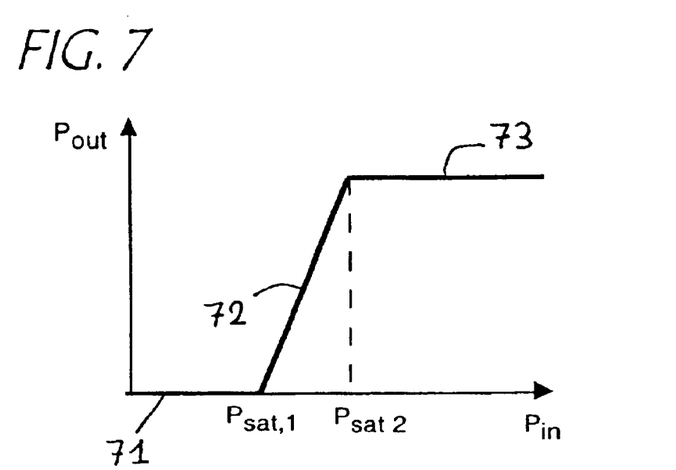
FIG. 7 represents a simplified output characteristic of an optical decision circuit, as illustrated in FIG. 4, according to an embodiment of the invention.

In a particular embodiment of the invention, an example of such an optical decision circuit will be described in detail (see also FIG. 4). An optical decision circuit is disclosed, comprising a Mach-Zehnder interferometer (MZI) and two gain clamped semiconductor optical amplifiers (42) (43) and where said interferometer further comprises a beam splitter (41), a phase shifting element (44) and a combiner (45). The GCSOA's are located in the branches of the interferometer. The interferometer is configured such that the beamsplitter for the incident signal as well as the combiner for the output signal are substantially symmetric giving a splitting ratio of 50/50. Furthermore, the optical decision circuit makes use of two essentially identical GCSOA's having essentially the same structure, essentially the same dimensions and being composed of essentially the same materials. Consequently both amplifiers have the same gain in the linear regime. However, the choice of a different bias current for both amplifiers (e.g. $I_1 > I_2$) results in a different saturation input power level. Because the interferometer has a 50/50 splitting ratio at the input, both amplifiers receive an input signal having equal input power (being 50% of the total input power). Furthermore because the interferometer has also a combining ratio of 50/50 at the output, both amplifiers contribute equally to the total output power of the decision circuit. Therefore, ideally, if one neglects the phase variations caused by the amplifiers and introduces a phase shift of 180 degrees in one of the branches of the interferometer, the total output power is given by the difference between the output powers of both amplifiers. Consequently the total output power of the decision circuit is zero as long as both amplifiers are in the linear regime, which is the low level (71), and equal to the difference in saturation output power if both amplifiers are in the saturation regime, which is the high level (73). The transition between these power levels is a linear transition (72). Preferably said phase shift of 180 degrees (in fact any phase shift) can be realised by applying a suitable voltage, typically in the order of a few Volts, to said branch of the interferometer. With no applied bias the phase shifts in the two branches are substantially equal if of course both branches have the same length. An alternative way of introducing an extra phase shift in one of the branches of the interferometer can be by prolonging said branch.

Figure 8:
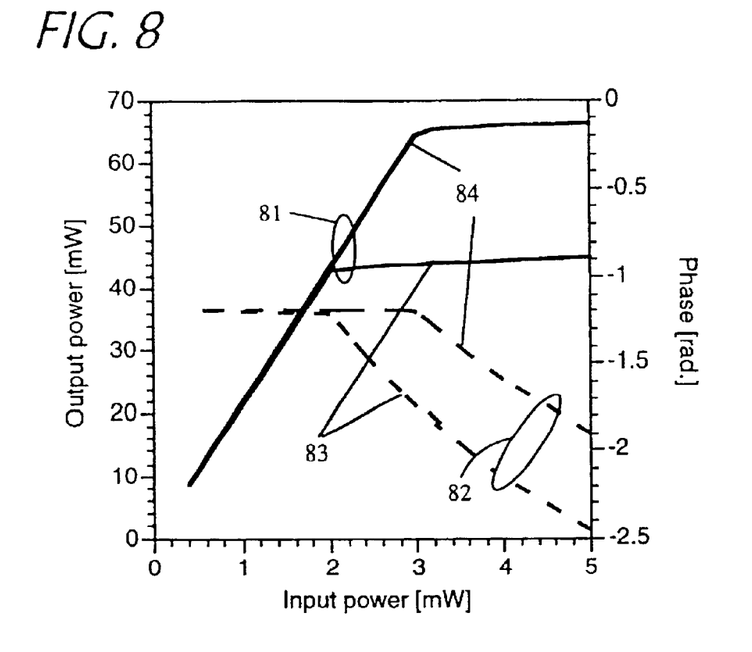
FIG. 8 represents the simulated output characteristics, i.e amplitude and phase of the output signal versus input power, of a state-of-the-art GCSOA at two different bias currents.
Figure 9:
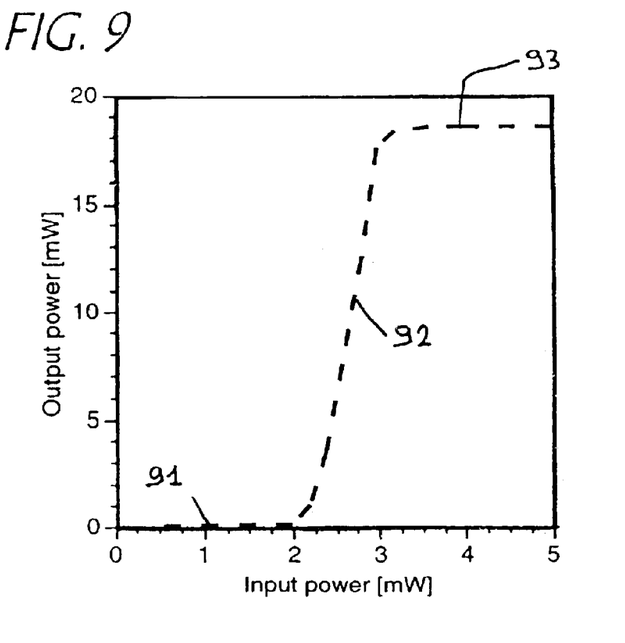
FIG. 9 represents a simulated output characteristic, i.e. output power versus input power, of a optical decision circuit according to an embodiment of the invention.

When taking into account the phase variations caused by the amplifiers, the relation between the output power of the decision circuit and the input power is less ideal (FIG. 8). In the linear regime, the gain and carrier density are clamped and therefore also the phase in both amplifiers is clamped and equal. However, beyond the saturation input power of the amplifier, when the carrier density starts to decrease, the refractive index starts to change and so does the phase. Calculations taking into account these phase variations have been performed and the results, both for the gain (81) as well as for the phase (82) are shown in FIG. 8 for the behaviour of the first amplifier (83) with a bias current of 86 mA as well as for the second amplifier (84) with a bias current of 117 mA. FIG. 9 represents a simulated output characteristic of an optical decision circuit based on the amplifiers whose characteristics were presented in FIG. 8. As can be seen in FIG. 9, the output power still remains constant and sufficiently small below an input power of 2 mW, which corresponds with the low level (91), and remains constant above the saturation input power of 3 mW, which corresponds with the high level (93). Furthermore, there is a steep transition (92) between both levels.

Figure 10:
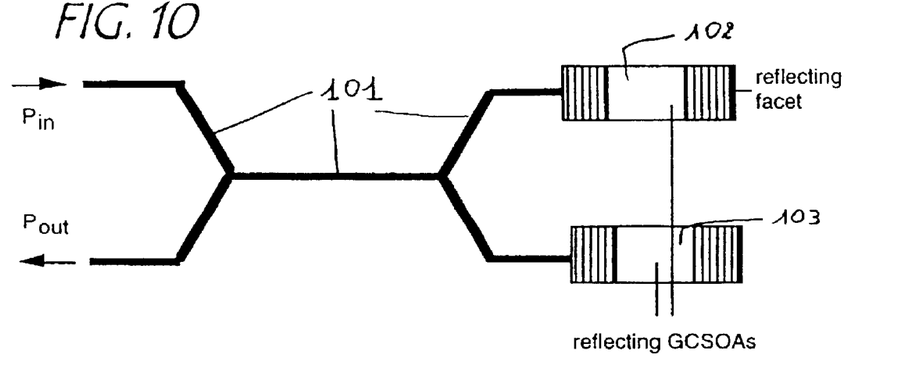
FIG. 10 represents a schematic example of an implementation of an optical decision circuit based on two identical reflecting GCSOA's and a Michelson interferometer according to an embodiment of the invention.

In an embodiment of the invention as an alternative an optical decision circuit is disclosed (FIG. 10) comprising a Michelson interferometer (101) and two essentially identical reflecting GCSOA's (102) (103), i.e. having essentially the same structure, essentially the same dimensions and being composed of essentially the same materials. Consequently both amplifiers have the same gain in the linear regime. The interferometer further comprises a 3 dB coupler, being used both as a beam splitter for the incident signal and as a combiner for the output signals of the reflecting GCSOA's, and a phase shifting element. Using a 3 dB coupler implies that the splitting ratio and the combining ratio are substantially equal to 50/50. Therefore by introducing a phase shift such that the phase difference between the output signal of the first reflective GCSOA and the output signal of the second reflective GCSOA is essentially 180 degrees the total output power level is given by the difference between the output powers levels of both GCSOA's.

In an embodiment of the invention an optical decision circuit is configured such that either the beamsplitter for the incident signal or the combiner for the output signal or the beamsplitter and the combiner are asymmetric giving a splitting ratio of $\alpha/(100-\alpha)$, $\alpha$ being different from 50 and $0<\alpha<100$, and/or a combining ratio of $\beta/(100-\beta)$, $\beta$ being different from 50 and $0<\beta<100$. When the input power of the incident signal is below a certain threshold value the optical decision circuit should return a low output power level, i.e. ideally a zero output power level or a level substantially below a predetermined high output power level. In this configuration, the amplitude of a first signal incident on a first GCSOA and the amplitude of a second signal incident on a second GCSOA can be substantially different due to the asymmetric splitting ratio. After amplification of these signals, at least the phase of one of the signals is shifted such that the phase difference between the first signal and the second signal is essentially 180 degrees. Consequently, thereafter combining the first and the second signal using a combiner with a combining ratio which can be asymmetric is in fact substracting the first and the second signal one from another. Therefore, this optical decision circuit should comprise two different GCSOA's, said GCSOA's should be chosen dependent on the value of the splitting ratio and the value of the combining ratio in order to establish a low level, i.e. an output power level substantially below the predetermined high output power level, of the optical decision circuit for input signal power levels below the threshold value.

Figure 11:
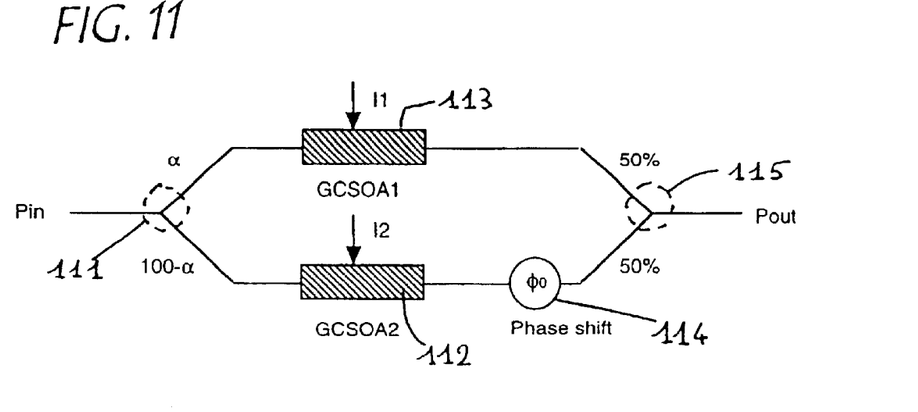
FIG. 11 represents an schematic example of an optical decision circuit with an asymmetric beam splitter according to an embodiment of the invention.

In a particular embodiment of the invention, an example (see also FIG. 11) of such an optical decision circuit will be described in detail. An optical decision circuit is disclosed, comprising a Mach-Zehnder interferometer (MZI) and two gain clamped semiconductor optical amplifiers (112) (113) and where said interferometer further comprises a splitter (111), a phase shifting element (114) and a combiner (115). The GCSOA's are located in the branches of the interferometer. The interferometer is configured such that the beamsplitter for the incident signal is asymmetric with a splitting ratio of $\alpha/(100-\alpha)$, where $0<\alpha<100$, whereas the combiner for the output signal is substantially symmetric with a combining ratio of 50/50. The gains of the GCSOA's in the linear regime should be chosen such that the signals in both branches of the interferometer at the input of the combiner have the same amplitude (e.g. by using different dimensions)

and a phase difference of 180 degrees. The extra phase shift in one of the branches should be chosen to meet said phase difference of 180 degrees taking into account that the phase of the signal at the output of both amplifiers is substantially different in the linear regime because of the different gains.

In an aspect of the invention an optical decision circuit is disclosed for 3R regeneration, i.e. including retiming. Like for 2R regeneration this optical decision circuit should give a low output power level, i.e. ideally this low level is a zero output power level or an output power level substantially below the predetermined high output power level, if the input power is below a certain threshold value and should give a high output power level, i.e. ideally this high level is a constant predetermined high output power level, if the input power is above the threshold value and there should be a steep transition between the low level and the high level. However by adding a clock signal to the input signal incident on the optical decision circuit, said clock signal having the same period as said input signal, at predetermined times the amplitude of the total signal incident on the optical decision circuit is enhanced resulting in a shift of said transition between said low output power level and said high output power level to thereby establish a regeneration and a retiming of said input signal.

According to the present invention a device with an optical signal at its input and an optical signal at its output for optical signal regeneration is disclosed, where said optical output signal has a predetermined output power level, said device comprising:

a beam splitter for splitting said optical input signal, said optical input signal being a combination of an optical signal incident on said device and a clock signal having the same period as said incident optical signal, in at least a first and a second signal;

at least a first and a second gain clamped optical amplifier, said first amplifier amplifying said first signal, said second amplifier amplifying said second signal, said first and said second amplifier having a different saturation input power level;

a phase shifting element for shifting the phase of either one of said first signal or said second signal;

a combiner for combining said first and said second signal. Preferably said phase is shifted such that the phase difference between said first signal and said second signal is essentially 180 degrees.

Figure 12:
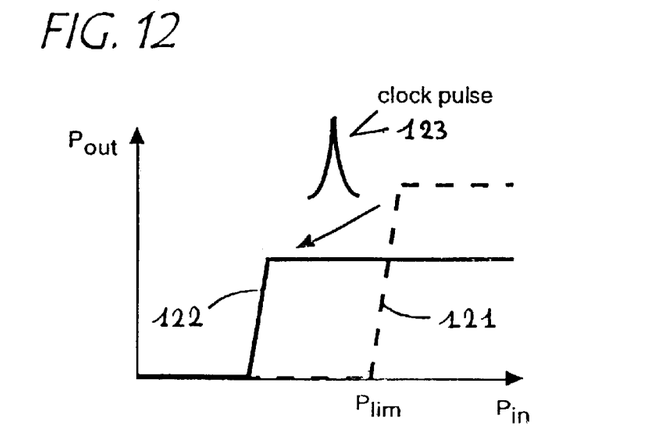
FIG. 12 represents the output characteristics, with and without retiming, of an optical decision circuit according to a particular embodiment of the invention. Said retiming is realised by adding a clock signal to the input of said optical decision circuit.

In a particular embodiment of the invention, an example of such an optical decision circuit will be described in detail. An optical decision circuit with retiming is disclosed, comprising a Mach-Zehnder interferometer (MZI) and two gain clamped semiconductor optical amplifiers (GCSOA's) and where said interferometer further comprises a splitter, a phase shifting element and a combiner. The GCSOA's are located in the branches of the interferometer. A typical output characteristic of an optical decision circuit without retiming (as e.g. FIG. 4) is depicted in FIG. 12 (121) and has the typical shape comprising a low level, a high level and a steep transition inbetween the low and high level. The transition starts at the saturation input power, $P_{lim}$, of the GCSOA with the lowest bias current (and thus the lowest saturation input power level). Using this optical decision circuit 3R generation including retiming can be achieved by adding a clock signal to the input signal of said circuit. When the clock pulse (123) enters the circuit of FIG. 4, it causes a shift of the characteristic to a lower saturation input power during the pulse duration as illustrated in FIG. 12 (122). As a result, for signal power levels below $P_{lim}$, one obtains a regeneration, both of the low level and of the high level, during the clock pulses and zero output power at other instants. Hence, 3R regeneration is obtained for RZ pulses.

What is claimed is:

1. A device for optical signal regeneration with an optical signal at its input and an optical signal at its output, where said optical output signal has a predetermined output power level, said device comprising:

a beam splitter for splitting said optical input signal in at least a first and a second signal;

at least a first and a second gain clamped optical amplifier, said first amplifier amplifying said first signal, said second amplifier amplifying said second signal, said first and said second amplifier having a different saturation input power level;

a phase shifting element for shifting the phase of either one of said first signal or said second signal;

a combiner for combining said first and said second signal.

2. A device as recited in claim 1, where said optical output signal has a predetermined high output power level or a low output power level, said low level being substantially below said predetermined high output power level, or an output power level inbetween said high output power level and said low output power level.

3. A device as recited in claim 1, where said phase shifting element creates a phase difference between said first and said second signal of essentially 180 degrees.

4. A device as recited in claim 1, comprising a Mach-Zehnder interferometer, said interferometer comprising said beam splitter, said phase shifting element and said combiner.

5. A device as recited in claim 1, where said beam splitter splits said optical signal in a first and a second signal with a splitting ratio of α/(100-α), where α is smaller than 100 and greater than 0.

6. A device as recited in claim 5, where said combiner has a combining ratio of β/(100-β), where β is smaller than 100 and greater than 0.

7. A device as recited in claim 5, where said splitting ratio is 50/50 and said combining ratio is 50/50 and wherein said first and said second gain clamped optical amplifier are essentially identical.

8. A device as recited in claim 7, where said first and said second gain clamped optical amplifier have essentially the same structure, essentially the same dimensions and are composed of essentially the same materials.

9. A method to achieve regeneration of an optical input signal comprising the steps of:

splitting said input signal in at least a first signal and a second signal;

amplifying said first signal by means of a first gain clamped optical amplifier and amplifying said second signal by means of a second gain clamped optical amplifier, said first and said second amplifier having a different saturation input power level;

shifting the phase of either one of said first signal or said second signal;

combining said first and said second signal thereby forming an optical output signal said optical output signal having a predetermined output power level.

10. A method as recited in claim 9, wherein said optical output signal has a predetermined high output power level or a low output power level, said low level being substantially below said predetermined high output power level, or an output power level inbetween said high output power level and said low output power level.

11. A method as recited in claim 9, wherein a clock signal is added to said input optical signal.

12. A method as recited in claim 9, wherein said phase is shifted such that the phase difference between said first and said second signal is essentially 180 degrees.

13. A method as recited in claim 9, wherein said splitting is performed with a ratio of 50/50 and said combining is performed with a ratio of 50/50 and wherein said first and said second gain clamped optical amplifier are essentially identical.

* * * * *